United States Patent
Fujita et al.

(10) Patent No.: US 11,152,208 B2
(45) Date of Patent: Oct. 19, 2021

(54) SEMICONDUCTOR FILM, METHOD OF FORMING SEMICONDUCTOR FILM, COMPLEX COMPOUND FOR DOPING, AND METHOD OF DOPING

(71) Applicants: FLOSFIA INC., Kyoto (JP); KYOTO UNIVERSITY, Kyoto (JP)

(72) Inventors: Shizuo Fujita, Kyoto (JP); Takayuki Uchida, Kyoto (JP); Kentaro Kaneko, Kyoto (JP); Masaya Oda, Kyoto (JP); Toshimi Hitora, Kyoto (JP)

(73) Assignees: FLOSFIA INC., Kyoto (JP); KYOTO UNIVERSITY, Kyoto (JP)

(*) Notice: Subject to any disclaimer, the term of this patent is extended or adjusted under 35 U.S.C. 154(b) by 225 days.

(21) Appl. No.: 16/332,659

(22) PCT Filed: Sep. 14, 2017

(86) PCT No.: PCT/JP2017/033358
§ 371 (c)(1),
(2) Date: Mar. 12, 2019

(87) PCT Pub. No.: WO2018/052097
PCT Pub. Date: Mar. 22, 2018

(65) Prior Publication Data
US 2021/0013035 A1    Jan. 14, 2021

(30) Foreign Application Priority Data

Sep. 15, 2016 (JP) .............. JP2016-181044
Sep. 15, 2016 (JP) .............. JP2016-181045

(51) Int. Cl.
*H01L 21/02* (2006.01)
*C23C 16/40* (2006.01)
*C23C 16/458* (2006.01)

(52) U.S. Cl.
CPC ........ *H01L 21/02381* (2013.01); *C23C 16/40* (2013.01); *C23C 16/4586* (2013.01); *H01L 21/02554* (2013.01)

(58) Field of Classification Search
None
See application file for complete search history.

(56) References Cited

U.S. PATENT DOCUMENTS 6,582,623 B1 * 6/2003 Grumbine ............... C09G 1/02
                                                           252/79.1
2006/0115934 A1 * 6/2006 Kim ................. H01L 21/02532
                                                           438/149
(Continued)

FOREIGN PATENT DOCUMENTS

EP     3 190 608      7/2017
JP     2003-273398    9/2003
(Continued)

OTHER PUBLICATIONS

International Search Report dated Jan. 9, 2018 in International (PCT) Application No. PCT/JP2017/033358 with English translation.
(Continued)

*Primary Examiner* — Asok K Sarkar
(74) *Attorney, Agent, or Firm* — Wenderoth, Lind & Ponack, L.L.P.

(57) ABSTRACT

A semiconductor film containing silicon that is evenly doped in the semiconductor film with an enhanced semiconductor property and a method of the semiconductor film using a dopant material containing a complex compound that contains at least silicon and a halogen. The complex compound further contains a hydrocarbon group that is optionally substituted or heterocyclic group that is optionally substituted. A semiconductor film containing Si doped into the semiconductor film as a dopant to a depth that is at least 0.3

(Continued)

µm or deeper from a surface of the semiconductor film is obtained by forming the semiconductor film in that the dopant material is doped, the semiconductor film is 100 µm or less in film thickness with carrier density that is $1 \times 10^{20}/cm^3$ or less and electron mobility that is $1 \ cm^2/Vs$ or more.

22 Claims, 8 Drawing Sheets

(56) References Cited

U.S. PATENT DOCUMENTS

| | | | |
|---|---|---|---|
| 2011/0151246 A1 | 6/2011 | Moreno et al. | |
| 2014/0217470 A1* | 8/2014 | Sasaki | H01L 29/7869 257/192 |
| 2015/0279671 A1* | 10/2015 | Kim | H01L 21/02565 438/104 |
| 2015/0325659 A1 | 11/2015 | Hitora et al. | |
| 2015/0325660 A1 | 11/2015 | Hitora et al. | |
| 2017/0278706 A1 | 9/2017 | Oda et al. | |
| 2018/0254355 A1* | 9/2018 | Sasaki | C30B 25/20 |
| 2019/0058043 A1 | 2/2019 | Dewey et al. | |
| 2020/0102667 A1* | 4/2020 | Goto | C23C 16/40 |

FOREIGN PATENT DOCUMENTS

| | | |
|---|---|---|
| JP | 2008-522437 | 6/2008 |
| JP | 2011-096884 | 5/2011 |
| JP | 2011-529804 | 12/2011 |
| JP | 2013-28480 | 2/2013 |
| JP | 2015-134717 | 7/2015 |
| JP | 2015-228495 | 12/2015 |
| WO | 2013/035841 | 3/2013 |
| WO | 2016/035696 | 3/2016 |

OTHER PUBLICATIONS

Written Opinion of the International Searching Authority dated Jan. 9, 2018 in International (PCT) Application No. PCT/JP2017/033358 with English translation.

Kentaro Kaneko, "Growth and Physical Properties of Corundum-Structured Gallium Oxide Alloy Thin Films", Dissertation, Kyoto Univ., Mar. 2013, pp. 1-116, with English translation of abstract.

Toshiyuki Oishi et al., "High-Mobility β-$Ga_2O_3$ (201) Single Crystals Grown by Edge-Defined Film-Fed Growth Method and Their Schottky Barrier Diodes with Ni Contact.", Applied Physics Express 8, The Japan Society of Applied Physics, 2015, pp. 031101-1-031101-3.

Rustum Roy et al., "Polymorphism of $Ga_2O_3$ and the System $Ga_2O_3$-$H_2O$", Contribution From School of Mineral Indust ies, The Pennsylvania State College, vol. 74, Feb. 5, 1952, pp. 719-722.

Raveen Kumaran, "New Solid State Laser Crystals Created by Epitaxial Growth", Thesis, The University of British Columbia, Sep. 2012, pp. 1-171.

Kentaro Kaneko et al., "Fabrication of Highly Crystalline Corundum-Structured α-$(Ga_{1-x}Fe_x)_2O_3$ Alloy Thin Films on Sapphire Structures", Applied Physics Express 2, The Japan Society of Applied Physics, 2009, pp. 075501-1-075501-3.

Toshiyuki Kawaharamura et al., "Successful Growth of Conductive Highly Crystalline Sn-Doped α-$Ga_2O_3$ Thin Films by Fine-Channel Mist Chemical Vapor Deposition", Japanese Journal of Applied Physics 51, 2012, pp. 040207-1-040207-3.

Kazuaki Akaiwa et al., "Electrical Conductive Corundum-Structured α-$Ga_2O_3$ Thin Films on Sapphire with Tin-Doping Grown by Spray-Assisted Mist Chemical Vapor Deposition", Japanese Journal of Applied Physics 51, 2012, pp. 070203-1-070203-3.

Giang T. Dang et al. "Mist-CVD Grown Sn-Doped α-$Ga_2O_3$ MESFETs", IEEE Transactions on Electron Devices, vol. 62, No. 11, Nov. 2015, pp. 3640-3644.

C. A. Hoel et al., "Pulsed-laser deposition of heteroepitaxial corundum-type ZITO: cor-$In_{2-2x}Zn_xSn_xO_3$", Thin Solid Films 520 (2012), pp. 2938-2942, 2012.

G. T. Dang et al., "Mist-CVD Grown Sn-Doped α-$Ga_2O_3$ MESFETs", IEEE Transactions on Electron Devices, vol. 62, No. 11, pp. 3640-3644, Nov. 2015.

I. A. Rauf, "Low resistivity and high mobility tin-doped indium oxide films", Materials Letters 18 (1993), pp. 123-127, 1993.

C-T. Lee et al., "Investigation of Ga Oxide Films Directly Grown on n-Type GaN by Photoelectrochemical Oxidation Using He-Cd Laser", Journal of Electronic Materials, vol. 34, No. 3, 2005, pp. 282-286, 2005.

K. Kaneko et al., "Growth and metal-oxide-semiconductor field-effect transistors of corundum-structured alpha indium oxide semiconductors", Applied Physics Express 8, 095503 (2015), pp. 09550-1-095503-3, 2015.

D. Y. Guo et al., "Epitaxial growth and solar-blind photoelectric properties of corundum-structured alpha-$Ga_2O_3$ thin films", Materials Letters 164 (2016), pp. 364-367, Available online: Nov. 2, 2015, 2015.

M. Oda et al., "Schottky barrier diodes of corundum-structured gallium oxide showing on-resistance of 0.1 mOhm-$cm^2$ grown by MIST EPITAXY", Applied Physics Express 9, 021101 (2016), pp. 021101-1-021101-3, 2016.

K. Akaiwa et al., "Conductivity control of Sn-doped alpha-Ga2O3 thin films grown on sapphire substrates", Japanese Journal of Applied Physics 55, 1202BA (2016). Published online: Nov. 9, 2016, p. 1202BA-1-1202BA-8, 2016.

X. Zhao et al., "Impurity Compensation Effect Induced by Tin Valence Change in α-$Ga_{1.4}Sn_{0.6}O_3$ Thin Films", ACS Applied Mateials & Interfaces 2017, 9, pp. 983-988, Published: Dec. 12, 2016, 2016.

Extended European Search Report dated Jan. 26, 2018 in European Patent Application No. 17188724.3.

K. Akaiwa, "Conductivity control and device applications of corundum-structured gallium oxide-based semiconductor", Thesis, Kyoto University, pp. 1-81, Mar. 2016 with English abstract.

R. Roy et al., "Polymorphism of $Ga_2O_3$ and the System $Ga_2O_3$-$H_2O$", Contribution from School of Mineral Industries, The Pennsylvania State College, Feb. 5, 1952, pp. 719-722, 1952.

S-D. Lee et al., "Thermal stability of single crystalline alpha gallium oxide films on sapphire substrates", Phys. Status Solidi C 10, No. 11, pp. 1592-1595 (2013) / DOI 10.1002/pssc. 201300259, 2013.

K. Sasaki et al.,"Si-Ion Implantation Doping in β-Ga2O3 and Its Application to Fabrication of Low-Resistance Ohmic Contacts", Applied Physics Express 6 (2013) 086502, pp. 086502-1-086502-4, 2013.

E. G. Villora et al., "Electrical conductivity and carrier concentration control in β-$Ga_2O_3$ by Si doping", Applies Physics Letters 92, 202120 (2008), p. 202120-1-202120-3, 2008.

* cited by examiner

SEMICONDUCTOR FILM, METHOD OF FORMING SEMICONDUCTOR FILM, COMPLEX COMPOUND FOR DOPING, AND METHOD OF DOPING

TECHNICAL FIELD

The present inventive subject matter relates to a complex compound to be doped into a semiconductor. Also, the present inventive subject matter relates to a method of doping a complex compound into a semiconductor. The present inventive subject matter further relates to a semiconductor film that is useful for a semiconductor device. Also, the present inventive subject matter relates to a method of forming a semiconductor film. Furthermore, the present inventive subject matter relates to a semiconductor device including a semiconductor film and also relates to a semiconductor system including a semiconductor film.

As a switching device of the next generation achieving a high withstand voltage, a low loss, and high temperature resistance, a semiconductor device using gallium oxide ($Ga_2O_3$) with a large band gap attracts attention and is expected to be applied to power semiconductor devices including an inverter. Also, gallium oxide is expected to be applied to a light emitting and/or receiving element such as a light emitting diode (LED) and a sensor, due to a wide band gap of gallium oxide. According to NPL 1, such gallium oxide has a band gap that may be controlled by forming mixed crystal with indium or aluminum singly or in combination and such a mixed crystal is an extremely attractive material as an InAlGaO-based semiconductor. Here, InAlGaO-based semiconductors refer to $In_XAl_YGa_ZO_3$ (0≤X≤2, 0≤Y≤2, 0≤Z≤2, X+Y+Z=1.5~2.5) and can be viewed as the same material system containing gallium oxide.

In recent years, studies on using tin or silicon as a dopant are proceeding, and Non-patent document 2 describes that silicon is used as a dopant in the EFG method. However, in the EFG method, a vacuum facility is necessary. Also, the EFG method is not suitable for doping a dopant into a thin film, and those making it difficult to obtain a semiconductor film required industrially. Furthermore, since it was not possible by the EFG method to obtain an oxide semiconductor film with a corundum structure such as $\alpha$-$Ga_2O_3$ which is a metastable phase, there were still problems left to obtain a switching element of a next generation with a larger band gap than the band gap of $\beta$-$Ga_2O_3$ that is the most stable phase.

Also, in Patent Document 1, doping is performed by ion implantation in manufacturing a $\beta$-$Ga_2O_3$ based element by use of an MBE method. Also, silicon is mentioned as an example of an n-type dopant. However, when doping is performed by ion implantation, there was a problem that the element was not able to be used without being annealed at a high temperature (1000° C., for example). Also, by the method described in the Patent Document 1, even if an activation annealing treatment is performed, for example, when silicon is used as a dopant, crystal defects tend to generate, electric characteristics tend to be insufficient, and it was difficult to obtain a film with electron mobility that is 1 $cm^2$/Vs or more.

Furthermore, the Patent Document 2 describes that silicon can be used as an n-type dopant for an $\alpha$-$Ga_2O_3$ film, however, there was no example of actually performing silicon doping, and when tetraethyl orthosilicate (TEOS) or the like assumed as a material used for doping silicon is actually used, doping would not be successful, or even if doping is conducted, it was difficult to obtain the film with electron mobility to be enhanced to 1 $cm^2$/Vs or more. Accordingly, there was a problem that the film was insufficient in the electric characteristics to be used in a semiconductor device.

Furthermore, the Patent Document 3 describes that silicon is doped into an $\alpha$-$Ga_2O_3$ film by using silicon bromide as a dopant raw material. However, when silicon bromide is used as a dopant raw material, the dopant raw material is not excellent in thermal stability, crystal defects tend to generate, homogenous doping cannot be performed, and there is a problem of deterioration, and thus, a method of doping, that is industrially useful, has been required.

Patent Document 1: WO2013/035841
Patent Document 2: JP2015-134717
Patent Document 3: JP2015-228495

Non Patent Literature

NPL 1: Kaneko, Kentaro, "Fabrication and physical properties of corundum structured alloys based on gallium oxide", Dissertation, Kyoto Univ., March 2013.
NPL2: Oishi, Toshiyuki, et al. "High-mobility $\beta$-$Ga_2O_3$ single crystals grown by edge-defined film-fed growth method and their Schottky barrier diodes with Ni contact.", Applied Physics Express 8.3(2015): 031101.

An object of the present invention is to provide a complex compound for doping industrially advantageously, and also an object of the present invention is to provide a method of doping by use of a complex compound. Furthermore, an object of the present inventive subject matter is to provide a semiconductor film in that a dopant (for example, silicon or the like) is evenly doped to have an enhanced electric property, and also an object of the present invention is to provide a method of manufacturing a semiconductor film.

As a result of intensive studies to achieve the object as mentioned above, the present inventors have found that a semiconductor film manufactured by using a dopant material containing a complex compound containing at least a dopant, a halogen, and a hydrocarbon group that is optionally substituted or heterocyclic group that is optionally substituted contained the dopant evenly doped in the semiconductor film surprisingly, even without performing treatments such as ion implantation and/or annealing that are treatments for doping after the semiconductor film. Also, the obtained semiconductor film was found to have an enhanced electrical property, and the dopant material was found to solve the conventional problem as mentioned above.

After learning the above findings, the present inventors have made further researches to complete the present invention. That is, the present inventive subject matter relates to the followings.

[1] A method of manufacturing a semiconductor film includes forming a semiconductor film in that a dopant material is doped. The dopant material contains a complex compound that contains at least a dopant and a halogen, and the complex compound further contains a hydrocarbon group that is optionally substituted or heterocyclic group that is optionally substituted.

[2] The method of [1], wherein the complex compound is represented by a chemical formula that is $XMR^1_lR^2_mR^3_n$, wherein X represents a halogen atom, M represents a dopant, $R^1$ represents a hydrocarbon group that is optionally substituted or heterocyclic group that is optionally substituted, $R^2$ represents a hydrocarbon group that is optionally substituted or a heterocyclic group that is optionally substituted and $R^2$ is the same as $R^1$ or different from $R^1$, $R^3$ represents a hydrocarbon group that is optionally substituted or heterocyclic group that is optionally substituted and $R^3$ is the same as $R^1$ and/or $R^2$ or different from $R^1$ and/or $R^2$, and wherein l represents an integer from one to three, m represents an integer from one to three and m is the same integer as l or a different integer from l, n represents an integer from one to three and n is the same integer as l and/or m or a different integer number from l and/or m.

[3] The method of [1], wherein the hydrocarbon group that is optionally substituted or heterocyclic group that is optionally substituted is a hydrocarbon group including a substituent that is a cyano group.

[4] The method of [1], wherein the halogen is chlorine.

[5] The method of [1], wherein the dopant contains Si.

[6] A method of manufacturing a semiconductor film includes forming a semiconductor film in that a dopant material is doped, the dopant material contains a complex compound that contains at least silicon and a halogen, and the complex compound further containing a hydrocarbon group that is optionally substituted or heterocyclic group that is optionally substituted.

[7] The method of [6], wherein the complex compound contains the hydrocarbon group with two or more substituents or heterocyclic group with two or more substituents.

[8] The method of [6], wherein the complex compound is represented by a chemical formula that is $XSiR^1{}_lR^2{}_mR^3{}_n$, wherein X represents a halogen atom, M represents a dopant, $R^1$ represents a hydrocarbon group that is optionally substituted or heterocyclic group that is optionally substituted, $R^2$ represents a hydrocarbon group that is optionally substituted or heterocyclic group that is optionally substituted and $R^2$ is the same as $R^1$ or different from $R^1$, $R^3$ represents a hydrocarbon group that is optionally substituted or heterocyclic group that is optionally substituted and $R^3$ is the same as $R^1$ and/or $R^2$ or different from $R^1$ and/or $R^2$, and wherein l represents an integer from one to three, m represents an integer from one to three and m is the same integer as l or a different integer from l, n represents an integer from one to three and n is the same integer as l and/or m or a different integer from l and/or m.

[9] The method of [6], wherein the hydrocarbon group that is optionally substituted or heterocyclic group that is optionally substituted is a hydrocarbon group including a substituent that is a cyano group.

[10] The method of [6], wherein the halogen is chlorine.

[11] A semiconductor film that is manufactured by a method of any of [1] to [10].

[12] A semiconductor device includes the semiconductor film of [11]; and an electrode.

[13] A semiconductor system includes the semiconductor device of [12].

[14] A semiconductor film contains an oxide semiconductor as a major component; and Si that is doped into the semiconductor film as a dopant so that carrier density of Si is $1\times10^{18}/cm^3$ or more in a depth ranged at least from 0.1 μm to 0.5 μm from a surface of the semiconductor film.

[15] A semiconductor film contains Si that is doped into the semiconductor film as a dopant to a depth that is at least 0.3 μm or deeper from a surface of the semiconductor film; and has 100 μm or less in film thickness with electron mobility that is 1 $cm^2/Vs$ or more.

[16] The semiconductor film of [14] or [15], wherein the carrier density of Si is $1\times10^{20}/cm^3$ or less.

[17] A semiconductor device includes the semiconductor film of [14] or [15]; and an electrode.

[18] A semiconductor system includes the semiconductor device of [17].

[19] A complex compound for doping contains at least a dopant and a halogen, and the complex compound further contains a hydrocarbon group that is optionally substituted or heterocyclic group that is optionally substituted.

[20] The complex compound of [19], wherein the hydrocarbon group that is optionally substituted or heterocyclic group that is optionally substituted contains two or more substituents.

[21] The complex compound of [19], wherein the complex compound is represented by a chemical formula that is $XMR^1{}_lR^2{}_mR^3{}_n$, wherein X represents a halogen atom, M represents a dopant, $R^1$ represents a hydrocarbon group that is optionally substituted or a heterocyclic group that is optionally substituted, $R^2$ represents a hydrocarbon group that is optionally substituted or heterocyclic group that is optionally substituted and $R^2$ is the same as $R^1$ or different from $R^1$, $R^3$ represents a hydrocarbon group that is optionally substituted or heterocyclic group that is optionally substituted and $R^3$ is the same as $R^1$ and/or $R^2$ or different from $R^1$ and/or $R^2$, and wherein l represents an integer from one to three, m represents an integer from one to three and m is the same integer as l or a different integer from l, n represents an integer from one to three and n is the same integer as l and/or m or a different integer from l and/or m.

[22] The complex compound of [19], wherein the hydrocarbon group that is optionally substituted or heterocyclic group that is optionally substituted is a hydrocarbon group including a substituent that is a cyano group.

[23] The complex compound of [19], wherein the halogen is chlorine.

[24] The complex compound of [19], wherein the complex compound is used for a semiconductor with a corundum structure.

[25] The complex compound of [19], wherein the complex compound is used for an oxide semiconductor.

[26] A method of doping a complex compound includes doping the complex compound of any one of [19] to [25] to obtain a semiconductor.

[27] A semiconductor, wherein the semiconductor is doped by the method of [26].

[28] The semiconductor of [27] or [28], wherein the semiconductor has a film shape.

[29] The semiconductor device includes a semiconductor film that contains the semiconductor of [27] or [28] as a major component; and an electrode.

[30] A semiconductor system includes the semiconductor device of [29].

A complex compound for doping according to a present inventive subject matter is able to be evenly doped in a semiconductor film. Also, it is possible to dope the complex compound in a semiconductor film industrially advantageously. A semiconductor film according to a present inventive subject matter is evenly doped with the complex compound and with an enhanced electrical property. Furthermore, by a method of forming a semiconductor film according to a present inventive subject matter, such semiconductor films are able to be industrially advantageously manufactured.

Figure 1:
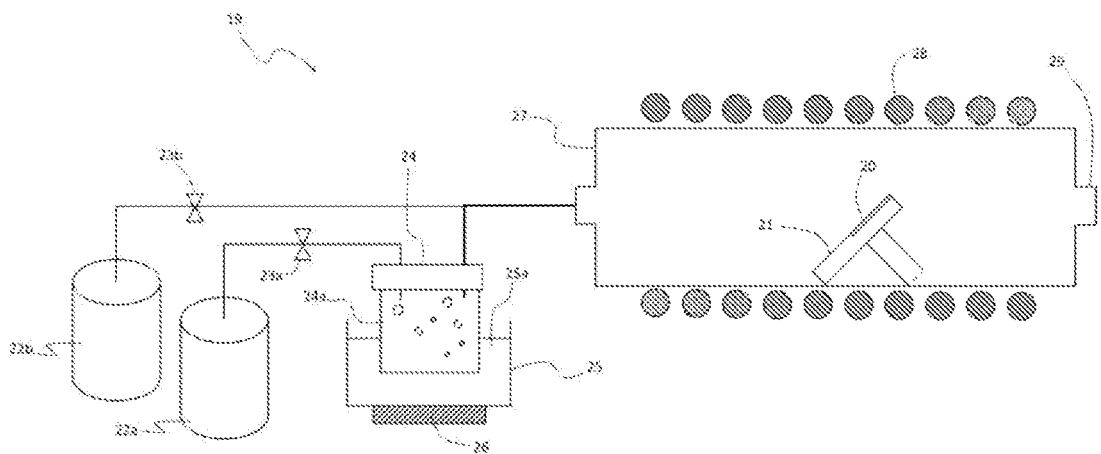
FIG. 1 shows a film (layer)-formation apparatus as mist CVD apparatus used in Examples.

Embodiments of a present inventive subject matter will be described as follows.

A complex compound of a present inventive subject matter is used for doping a dopant to obtain a semiconductor. It is characterized in that the complex compound contains at least a dopant and a halogen, and the complex compound further contains a hydrocarbon group that is optionally substituted or heterocyclic group that is optionally substituted.

The complex compound is not particularly limited as long as the complex compound contains at least a dopant, a halogen, and a hydrocarbon group that is optionally substituted or heterocyclic group that is optionally substituted. According to a present inventive subject matter, the complex compound preferably contains a hydrocarbon group optionally with two or more substituents or heterocyclic group optionally with two or more substituents. The complex compound is represented by a chemical formula that is $XMR^1_l R^2_m R^3_n$, wherein X represents a halogen atom, M represents a dopant, $R^1$ represents a hydrocarbon group that is optionally substituted or heterocyclic group that is optionally substituted, $R^2$ represents a hydrocarbon group that is optionally substituted or heterocyclic group that is optionally substituted and $R^2$ is the same as $R^1$ or different from $R^1$, $R^3$ represents a hydrocarbon group that is optionally substituted or heterocyclic group that is optionally substituted and $R^3$ is the same as $R^1$ and/or $R^2$ or different from $R^1$ and/or $R^2$, and wherein l represents an integer from one to three, m represents an integer from one to three and m is the same integer as l or a different integer from l, n represents an integer from one to three and n is the same integer as l and/or m or a different integer number from l and/or m.

A method of manufacturing a semiconductor film of a present inventive subject matter is a method of manufacturing a semiconductor film in that a dopant is doped by use of a dopant material. It is characterized in that the dopant material contains a complex compound containing at least silicon and a halogen, and the complex compound further contains a hydrocarbon group that is optionally substituted or heterocyclic group that is optionally substituted.

It is preferable that the dopant material contains a complex compound containing at least silicon and a halogen, and the complex compound further contains a hydrocarbon group that is optionally substituted or heterocyclic group that is optionally substituted.

The complex compound is not particularly limited as long as the complex compound contains at least a dopant (that is preferably silicon), a halogen, and a hydrocarbon group that is optionally substituted or heterocyclic group that is optionally substituted, however, according to a present inventive subject matter, the complex compound preferably contains the hydrocarbon group optionally with two or more substituents or heterocyclic group optionally with two or more substituents. The complex compound is further preferably represented by a chemical formula that is $XSiR^1_l R^2_m R^3_n$, and X represents a halogen atom, $R^1$ represents a hydrocarbon group that is optionally substituted or heterocyclic group that is optionally substituted, $R^2$ represents a hydrocarbon group that is optionally substituted or heterocyclic group that is optionally substituted and $R^2$ is the same as $R^1$ or different from $R^1$, $R^3$ represents a hydrocarbon group that is optionally substituted or heterocyclic group that is optionally substituted and $R^3$ is the same as $R^1$ and/or $R^2$ or different from $R^1$ and/or $R^2$, and wherein l represents an integer from one to three, m represents an integer from one to three and m is the same integer as l or a different integer from l, n represents an integer from one to three and n is the same integer as l and/or m or a different integer from l and/or m.

Examples of "halogen" include fluorine, chlorine, bromine and iodine. According to a present inventive subject matter, the "halogen" is preferably chlorine, and the complex compound containing a single halogen atom enhances handleability of a raw material solution, and easily and suitably used in a method such as a mist CVD method.

Examples of the dopant include an n-type dopant and a p-type dopant. Examples of the n-type dopant include Sn, Ti, ZR, Hf, V, Nb, Ta, Mo, W, Ru, Rh, Ir, C, Si, Ge, Pb, Mn, As, Sb, and Bi. Also, examples of the p-type dopant include Mg, H, Li, Na, K, Rb, Cs, Fr, Be, Ca, Sr, Ba, Ra, Mn, Fe, Co, Ni, Pd, Cu, Ag, Au, Zn, Cd, Hg, Tl, Pb, N and P. According to a present inventive subject matter, the dopant is preferably an n-type dopant, further preferably Si, because Si is more stable in a complex compound, compared with other dopants.

Silicon means to what is defined as Si in International Union of Pure and Applied Chemistry (IUPAC). According to a present inventive subject matter, silicon used as a dopant enhances the stability in the complex compound more, compared with other dopants.

As the hydrocarbon group that is optionally substituted or heterocyclic group that is optionally substituted includes a hydrocarbon group, a hydrocarbon group optionally with a substituent or a heterocyclic group optionally with a substituent is named.

As the "hydrocarbon group optionally having a substituent(s)", a hydrocarbon group or a substituted hydrocarbon group are named.

Examples of the "substituent" according to a present inventive subject matter include a hydrocarbon group that is optionally substituted, a heterocyclic group that is optionally substituted, a halogen atom, a halogenated hydrocarbon group, —$OR^{1a}$ ($R^{1a}$ represents a hydrogen atom, a hydrocarbon group that is optionally substituted, or a heterocyclic group that is optionally substituted), —$SR^{1b}$ ($R^{1b}$ represents a hydrogen atom, a hydrocarbon group that is optionally substituted, or a heterocyclic group that is optionally substituted), an acyl group that is optionally substituted, an acyloxy group that is optionally substituted, an alkoxycarbonyl group that is optionally substituted, an allyloxycarbonyl group that is optionally substituted, an alkylenedioxy group that is optionally substituted, a nitro group, an amino group, a substituted amino group, a cyano group, a sulfo group, a substituted silyl group, a hydroxyl group, a carboxy group, alcoxythiocarbonyl group that is optionally substituted, aryloxythiocarbonyl group that is optionally substituted, an alkyl thiocarbonyl group that is optionally substituted, an aryl thiocarbonyl group that is optionally substituted, a carbamoyl group that is optionally substituted, a substituted carbamoyl group, a substituted phosphino group, an aminosulfonyl group, an alkoxy sulfonyl group, and an oxo group. According to a present inventive subject matter, the substituent is preferably a cyano group.

Examples of the "hydrocarbon group" include a hydrocarbon group and a substituted hydrocarbon group. As the "hydrocarbon group", for example, an alkyl group, an aryl group, and an aralkyl group may be named.

The alkyl group is preferably a linear alkyl group having 1 to 20 carbon atoms, a branched alkyl group having 1 to 20 carbon atoms, and a cyclic alkyl group having 1 to 20 carbon atoms. Specific examples of the alkyl group include methyl, ethyl, n-propyl, 2-propyl, n-butyl, 1-methylpropyl, 2-methylpropyl, tert-butyl, n-pentyl, 1-methylbutyl, 1-Ethylpropyl, tert-pentyl, 2-methylbutyl, 3-methylbutyl, 2,2-dimethylpropyl, n-hexyl, 1-methylpentyl, 1-ethylbutyl, 2-methylpentyl, 3-methylpentyl, 4-methylpentyl, 2-methyl pentane, 2-methylpentan-3-yl, 3,3-dimethylbutyl, 2,2-dimethylbutyl, 1,1-dimethylbutyl, 1,2-dimethylbutyl, 1,3-dimethylbutyl, 2,3-dimethylbutyl, 1-ethylbutyl, 2-ethylbutyl, heptyl, octyl, nonyl, decyl, undecyl, dodecyl, tridecyl, tetradecyl, pentadecyl, hexadecyl, heptadecyl, octadecyl, nonadecyl, eicosyl, cyclopropyl, cyclobutyl, cyclopentyl and cyclohexyl. The alkyl group is preferably an alkyl group having 1 to 10 carbon atoms, still further preferably an alkyl group having 1 to 6 carbon atoms, and particularly preferably an alkyl group having 1 to 4 carbon atoms.

The aryl group is preferably an aryl group having 6 to 20 carbon atoms. Specific examples of the aryl group include phenyl, indenyl, pentalenyl, naphthyl, azulenyl, fluorenyl, phenanthrenyl, anthracenyl, acenaphthylenyl, biphenylenyl, naphthacenyl and pyrenyl. Among them, an aryl group having 6 to 14 carbon atoms is further preferable.

The aralkyl group is preferably an aralkyl group having 7 to 20 carbon atoms. Specific examples of the aralkyl group include benzyl, phenethyl, 1-phenylpropyl, 2-phenylpropyl, 3-phenylpropyl, 1-phenylbutyl, 2-phenylbutyl, 3-phenylbutyl, 4-phenylbutyl, 1-phenylpentylbutyl, 2-phenylpentylbutyl, 3-phenylpentylbutyl, 4-phenylpentylbutyl, 5-phenylpentylbutyl, 1-phenylhexylbutyl, 2-phenylhexylbutyl, 3-phenylhexylbutyl, 4-phenylhexylbutyl, 5-phenylhexylbutyl, 6-phenylhexylbutyl, 1-phenylheptyl, 1-phenyloctyl, 1-phenylnonyl, 1-phenyldecyl, 1-phenylundecyl, 1-phenyldodecyl, 1-phenyltridecyl and 1-phenyl-tetradecyl. Among them, the aralkyl group is further preferably an aralkyl group having 7 to 12 carbon atoms.

As a substituent that the "hydrocarbon group" may have, the examples of the "substituent" mentioned above are referred to. Specific examples of hydrocarbon group having a substitute include a substituted alkyl group such as trifluoromethyl and methoxymethyl, tolyl (eg, 4-methylphenyl), xylyl (eg, 3,5-dimethylphenyl), 4-methoxy-3,5-dimethylphenyl, a substituted aryl group such as 4-methoxy-3,5-di-t-butylphenyl, and a substituted aralkyl group.

The "heterocyclic group optionally having a substituent" include a heterocyclic group and a substituted heterocyclic group. Examples of the heterocyclic group include an aliphatic heterocyclic group and an aromatic heterocyclic group. The aliphatic heterocyclic group may be three- to eight-membered, monocyclic aliphatic heterocyclic group, a polycyclic aliphatic heterocyclic group, or a fused-ring aliphatic heterocyclic group. The aliphatic heterocyclic group may be preferably five- or six-membered, monocyclic aliphatic heterocyclic group, a polycyclic aliphatic heterocyclic group, or a fused-ring aliphatic heterocyclic group. The aliphatic heterocyclic group includes, for example, an aliphatic heterocyclic group having 2 to 14 carbon atoms and containing at least one heteroatom, preferably heteroatom(s) such as one to three nitrogen atom(s), oxygen atom(s), and/or sulfur atom(s). Specific examples of the aliphatic heterocyclic group include a pyrrolidyl-2-one, a piperidyl group, a tetrahydrofuryl group, a tetrahydropyranyl group, a thiolanyl group, and a succinimidyl group.

The aromatic heterocyclic group may be a monocyclic group having three to eight members or preferably a monocyclic group having five or six members, and the monocyclic group, for example, having two to 15 carbon atoms and containing at least one heteroatom, preferably heteroatom(s) that may be one to three nitrogen atom(s), oxygen atom(s) and/or sulfur atom(s). Also, the aromatic heterocyclic group may be a polycyclic group having three to eight members or preferably a polycyclic group having five or six members, and the polycyclic group, for example, having two to 15 carbon atoms and containing at least one heteroatom, preferably heteroatoms that may be one to three nitrogen atom(s), oxygen atom(s) and/or sulfur atom(s). The aromatic heterocyclic group may be a fused ring heterocyclic group having three to eight members or preferably a fused ring heterocyclic group having five or six members, and the fused ring heterocyclic group, for example, having two to 15 carbon atoms and containing at least one heteroatom, preferably heteroatoms that may be one to three nitrogen atom(s), oxygen atom(s) and/or sulfur atom(s). For more details, specific examples of the aromatic heterocyclic group include furyl, thienyl, pyrrolyl, oxazolyl, isoxazolyl, thiazolyl, isothiazolyl, imidazolyl, pyrazolyl, 1,2,3-oxadiazolyl, 1,2,4-oxadiazolyl, 1,3,4-oxadiazolyl, furazanyl, 1,2,3-thiadiazolyl, 1,2,4-thiadiazolyl, 1,3,4-thiadiazolyl, 1,2,3-triazolyl, 1,2,4-triazolyl, tetrazolyl, pyridyl, pyridazinyl, pyrimidinyl, pyrazinyl, triazinyl, benzofuranyl, isobenzofuranyl, benzo [b] thienyl, indolyl, isoindolyl, 1H-indazolyl, benzimidazolyl, benzoxazolyl, 1,2-benzisoxazolyl, benzothiazolyl, benzopyrani, 1,2-benzisothiazolyl, 1H-benzotriazolyl, quinolyl, isoquinolyl, cinnolinyl, quinazolinyl, quinoxalinyl, phthalazinyl, naphthyridinyl, purinyl, pteridinyl, carbazolyl, α-carbolinyl, β-carbolinyl, γ-carbolinyl, acridinyl, phenoxazinyl, phenothiazinyl, phenazinyl, phenoxathiinyl, thianthrenyl, phenanthridinyl, phenanthrolinyl, indolizinyl, pyrrolo [1,2-b] pyridazinyl, pyrazolo [1,5-a] pyridyl, imidazo [1,2-a] pyridyl, imidazo [1,5-a] pyridyl, imidazo [1,2-b] pyridazinyl, imidazo [1,2-a] pyrimidinyl, 1,2,4-triazolo [4,3-a] pyridyl, 1,2,4-tri asolo [4,3-b] pyridazinyl, benzo [1,2,5] thiadiazolyl, benzo [1,2,5] oxadiazolyl, and futaruimino group.

As a substituent that the "heterocyclic group" may have, the examples of the "substituent" mentioned above are referred to.

According to a present inventive subject matter, the complex compound is preferably substituted by three or more substituents, which may be further preferably at least one selected from an alkyl group and a cyano alkyl group, and most preferably include both an alkyl group and a cyano alkyl group. Here, the alkyl group may be the same as previously described. Examples of the cyano alkyl group include a cyano-methyl group, a cyano-ethyl group, a cyano-propyl group, a cyano-butyl group, and a cyano-isobutyl group.

The complex compound may be obtained by use of a known method. Also, the complex compound is suitably used as a dopant doped into a semiconductor. According to a present inventive subject matter, the dopant material is preferably used together with a semiconductor material(s) in a raw material solution.

Examples of the semiconductor material(s) include metals. The raw material solution is not particularly limited as long as the raw material solution contains the semiconductor material(s) and the dopant material. The raw material solution may contain an inorganic material, and also, the raw material solution may contain an organic material. According to a present inventive subject matter, a semiconductor material(s) and a dopant material preferably form a complex, and a raw material solution in that the dopant material and one or more metals selected from among aluminum, indium and gallium are dissolved or dispersed in a form of complex or salt in an organic solvent or in water is suitably used.

The solvent of the raw material solution is not particularly limited, and the solvent may be an inorganic solvent such as water, may be an organic solvent such as alcohol, or may be a mixture of an organic solvent and an inorganic solvent. According to a present inventive subject matter, the solvent preferably contains water, and also, the solvent preferably contains water and acid. Examples of water include pure water, ultrapure water, tap water, well water, mineral spring water, mineral water, hot spring water, spring water, fresh water, and seawater. According to a present inventive subject matter, the solvent is preferably ultrapure water. Also, examples of acid include an organic acid such as acetic acid, propionic acid, or butane acid, boron trifluoride, boron trifluoride etherate, boron trichloride, boron tribromide, trifluoroacetic acid, trifluoromethane sulfonic acid, p-toluenesulfonic acid, however, according to a present inventive subject matter, acetic acid is preferable.

Also, the raw material solution may further contain an additive(s) such as acid or alkali. According to a present inventive subject matter, hydrochloric acid, hydrobromic acid, and hydroiodic acid.

The content of metal(s) in the raw material solution is not particularly limited as long as an object of a present inventive subject matter is not interfered with, however, preferably in a range of 0.001 mol % to 50 mol %, and further preferably in a range of 0.01 mol % to 50 mol %. The dopant in the raw material solution may have a concentration that is in a range of $1\times10^{16}/cm^3$ to $1\times10^{22}/cm^3$. Also, the dopant concentration may be at a lower concentration of, for example, approximately $1\times10^{17}/cm^3$ or less. Furthermore, the dopant concentration may be at a high concentration of, for example, $1\times10^{20}/cm^3$ or more. According to embodiments of a present inventive subject matter, the dopant concentration is preferably $1\times10^{20}/cm^3$ or less, and further preferably $5\times10^{19}/cm^3$ or less.

A method of doping a dopant into a film is not particularly limited, and may be a method of ion implantation, however, the method of doping a dopant into a film is preferably conducted while the film is formed according to a present inventive subject matter, and the dopant material is usually together with semiconductor material(s) contained in a raw material solution. The method of forming a film is not particularly limited as log as the semiconductor film is formed, and may be formed by a known method, however, according to a present inventive subject matter, a mist CVD method is preferable. For more details, the method includes generating atomized droplets from a raw material solution (generating atomized droplets from a raw material solution), carrying the atomized droplets onto a surface of a base (carrying atomized droplets), forming a film by causing a thermal reaction of the atomized droplets adjacent to the base to form a semiconductor film on the base (film-formation), and since the dopant is evenly doped into a film, the method is preferable.

Embodiments of a present inventive subject matter are described as follows.

(Generating Atomized Droplets from a Raw Material Solution)

In generating atomized droplets, a raw material solution is turned into atomized droplets, and generating atomized droplets is not particularly limited and a known method may be used, however, the raw material solution is preferably atomized by use of ultrasonic vibration according to a present inventive subject matter. Atomized droplets obtained by using ultrasonic vibration have an initial velocity that is zero and floats in the space. Since atomized droplets floating in the space are carriable as a gas, the atomized droplets floating in the space are preferable to avoid damage caused by the collision energy without being blown like a spray. The size of droplets is not limited to a particular size, and may be a few mm, however, the size of the atomized droplets is preferably 50 μm or less. The size of the atomized droplets is preferably in a range of 0.1 μm to 10 μm.

(Base)

The base is not particularly limited if the base is capable of supporting the p-type oxide semiconductor film. The material for the base is also not particularly limited if an object of the present inventive subject matter is not interfered with, and the base may be a base of a known material. Also, the base may contain an organic compound and/or inorganic compound. Also, the base may be in any shape and may be valid for all shapes. Examples of the shape of the base include a plate shape, a flat shape, a disc shape, a fibrous shape, a rod shape, a cylindrical shape, a prismatic shape, a tubular shape, a spiral shape, a spherical shape, and a ring shape. According to an embodiment of the present inventive subject matter, a base may be preferably a substrate. Also, according to an embodiment of the present inventive subject matter, the thickness of the substrate is not particularly limited.

The substrate is not particularly limited as long as an object of a present inventive subject matter is not interfered with, and may be an electrically-insulating substrate, a semiconductor substrate, or an electrically-conductive substrate. The substrate may be a base substrate containing as a major component a corundum-structured substrate material, for example. Also, by use of the base substrate containing as a major component the corundum-structured substrate material, a semiconductor film to be grown on the base substrate also has a corundum structure. The term "major component" herein means, for example, an atomic ratio of a substrate material with a corundum structure in all the elements in a substrate material may be 50% or more. According to an embodiment of the present inventive subject matter, the atomic ratio of the substrate material with a certain crystal structure in all the metal elements in the substrate material may be preferably 70% or more. For the present inventive subject matter, the atomic ratio of the substrate material with a certain crystal structure in all the metal elements in the substrate material may be further preferably 90% or more and may be 100%.

The substrate material is not particularly limited as long as an object of a present inventive subject matter is not interfered with, and may be a known substrate material. Examples of the base substrate containing as a major component a corundum-structured substrate material include a sapphire substrate (which may be preferably a c-plane sapphire substrate) and an α-gallium oxide substrate.

According to a present inventive subject matter, it is possible to obtain corundum-structured oxide semiconductor films such as an α-Ga$_2$O$_3$ that is metastable by use of a suitable base substrate as above mentioned.

(Carrying Atomized Droplets)

In carrying atomized droplets, the atomized droplets are carried onto a base by carrier gas. The carrier gas is not particularly limited as long as an object of the present inventive subject matter is not interfered with, and thus, the carrier gas may be oxygen, ozone, an inert gas such as nitrogen or argon. Also, the carrier gas may be a reducing gas such as hydrogen gas or forming gas. The carrier gas may contain one or two or more gasses. Also, a diluted carrier gas at a reduced flow rate (e.g., 10-fold diluted carrier gas) and the like may be used as a second carrier gas. The carrier gas may be supplied from one or more locations. According to an embodiment of the present inventive subject matter, the flow rate of the carrier gas may be preferably in a range of 0.01 to 20 L/min, and further preferably in a range of 1 to 10 L/min. When a diluted carrier gas is used, the flow rate of the diluted carrier gas may be in a range of 0.001 to 2 L/min. Furthermore, according to an embodiment of the present inventive subject matter, when diluted carrier gas is used, the flow rate of the dilute carrier gas may be preferably in a range of 0.1 to 1 L/min.

(Film-Formation)

In the film-formation, the atomized droplets are thermally reacted adjacent to a surface of the base to form a film on at least a part of the base or entirely by a thermal reaction of the atomized droplets adjacent to the surface of the base. The thermal reaction is not particularly limited as long as the atomized droplets react on heating, and reaction conditions are not particularly limited as long as an object of the present inventive subject matter is not interfered with, however, according to method of a present inventive subject matter, the thermal reaction is preferably conducted at a temperature that is a temperature of evaporation of a solvent or higher but not so high. According to an embodiment of a present inventive subject matter, the thermal reaction is preferably conducted at 650° C. or less, and further preferably conducted in a range of 400° C. to 650° C. The thermal reaction may be conducted in any atmosphere of a vacuum, a non-oxygen atmosphere, a reducing gas atmosphere, and an oxidizing atmosphere. Also, the thermal reaction may be conducted in any conditions of at an atmospheric pressure, under an increased pressure, and under a reduced pressure, however, according to an embodiment of the present inventive subject matter, the thermal reaction is preferably conducted at an atmospheric pressure. Also, according to an embodiment of the present inventive subject matter, the thermal reaction is preferably conducted under an atmospheric pressure in a nitrogen atmosphere. The film thickness of the film is able to be determined by adjusting a film-formation time.

A semiconductor film obtained as the mentioned above contains a dopant (especially silicon) that is evenly doped in the semiconductor film to have an enhanced electrical property. For more details, the dopant (especially silicon) is evenly doped in the semiconductor film at least 0.3 µm in depth or deeper from a surface of the semiconductor film. The semiconductor film with 100 µm or less in film thickness of the semiconductor film and electron mobility that is 1 cm$^2$/Vs or more is obtainable.

For more details, a semiconductor film containing Si that is doped into the semiconductor film at least up to 0.3 µm in depth from a surface of the semiconductor film and with electron mobility that is 1 cm$^2$/Vs or more and film thickness that is 100 µm or less is obtainable. Also, according to a method of a present inventive subject matter, a semiconductor film containing Si that is doped into the semiconductor film as a dopant and with a carrier density of Si that is 1×10$^{18}$/cm$^3$ or more in a depth ranged at least from 0.1 µm to 0.5 µm from a surface of the semiconductor film is obtainable. Also, the semiconductor film is not particularly limited as long as the semiconductor film is filmy and contains a semiconductor as a major component. The semiconductor film may be a crystalline film or an amorphous film, and also, if the semiconductor film is a crystalline film, the semiconductor film may be a single crystal film or a polycrystalline film, however, according to a present inventive subject matter, the semiconductor film is preferably a crystalline film, and further preferably a single crystal film. The crystal structure of the semiconductor film is not particularly limited, and may be a corundum structure or may be a β-gallia structure, however, according to a present inventive subject matter, the semiconductor film preferably has a corundum structure. Also, the semiconductor film preferably contains an oxide semiconductor as a major component. The oxide semiconductor may preferably contain one metal or two or more metals selected from among aluminum, indium and gallium, and further preferably contains an InAlGaO-based semiconductor, and most preferably contains at least gallium.

The term "major component" herein means, for example, in a case that the oxide semiconductor of the semiconductor film is α-Ga$_2$O$_3$, α-Ga$_2$O$_3$ is contained in the semiconductor film with an atomic ratio of gallium in metal elements in the crystalline oxide semiconductor film to be 0.5 or more. According to a present inventive subject matter, the atomic ration of gallium in metal elements in the crystalline oxide semiconductor film is preferably 0.7 or more and further preferably 0.8 or more. The semiconductor film is not particularly limited in film thickness, however, due to a reason to be suitably used for a semiconductor device, the semiconductor film may be preferably 100 µm or less in thickness, further preferably 50 µm or less in thickness, and most preferably in a range of 0.1 µm to 10 µm.

According to a present inventive subject matter, the semiconductor film may be directly formed on the base, and also, the semiconductor film may be formed on a layer that is formed on the base and contains a chemical composition different from a chemical composition of the semiconductor film. Examples of the layer include a semiconductor layer, an electrically-insulating layer, and a buffer layer. Examples of the semiconductor layer include an n-type semiconductor layer, n$^+$-type semiconductor layer, and n$^-$-type semiconductor layer. Examples of the electrically-insulating layer include a semi-insulating layer.

An oxide semiconductor obtained by above-mentioned method is able to be used for a semiconductor device as a semiconductor layer. The semiconductor film is particularly useful for a power device. Semiconductor devices may be categorized into lateral devices and vertical devices. In a lateral device, a first electrode and a second electrode may be formed on one side of a semiconductor layer. In a vertical device, a first electrode may be formed on a first side of a semiconductor layer and a second electrode may be formed on a second side of the semiconductor layer. The first side is positioned opposite to the second side of the semiconductor layer. Examples of the semiconductor device include a Schottky barrier diode (SBD), a metal semiconductor field-effect transistor (MESFET), a high-electron-mobility transistor (HEMT), a metal oxide semiconductor field-effect transistor (MOSFET), a static induction transistor (SIT), a junction field-effect transistor (JFET), an insulated gate bipolar transistor (IGBT), and a light-emitting diode.

Examples of a semiconductor device in which the semiconductor film is used as a semiconductor layer are shown in FIG. 4 to FIG. 10. Note that the n-type semiconductor may contain as a major component a chemical composition that is the same as the chemical composition contained in the semiconductor film, and may contain an n-type dopant instead of a p-type dopant. Also, the n-type semiconductor may contain as a major component a different chemical composition that is different from the chemical composition contained in the semiconductor film.

Figure 4:
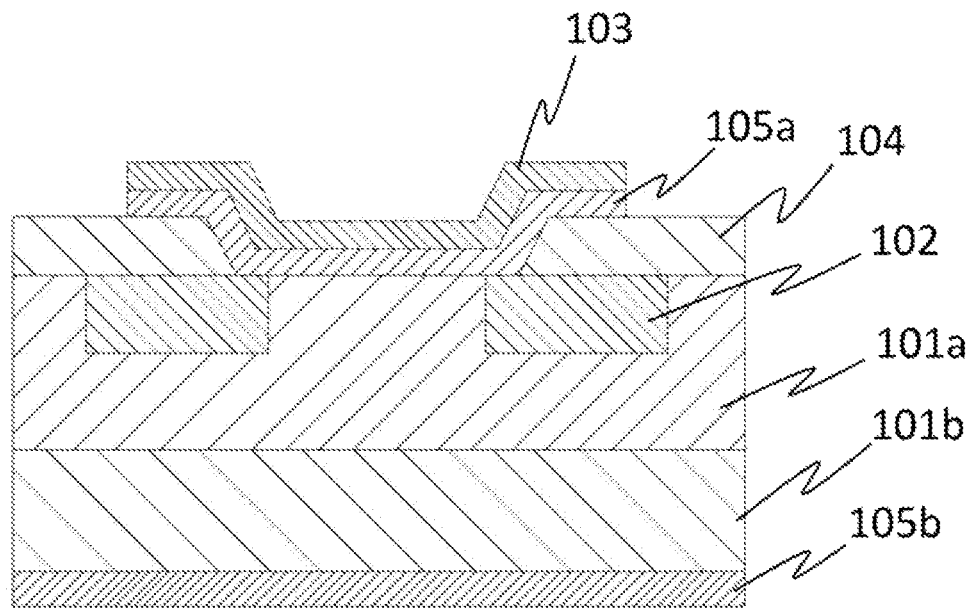
FIG. 4 shows a schematic view of a Schottky barrier diode (SBD) as an embodiment.
Figure 5:
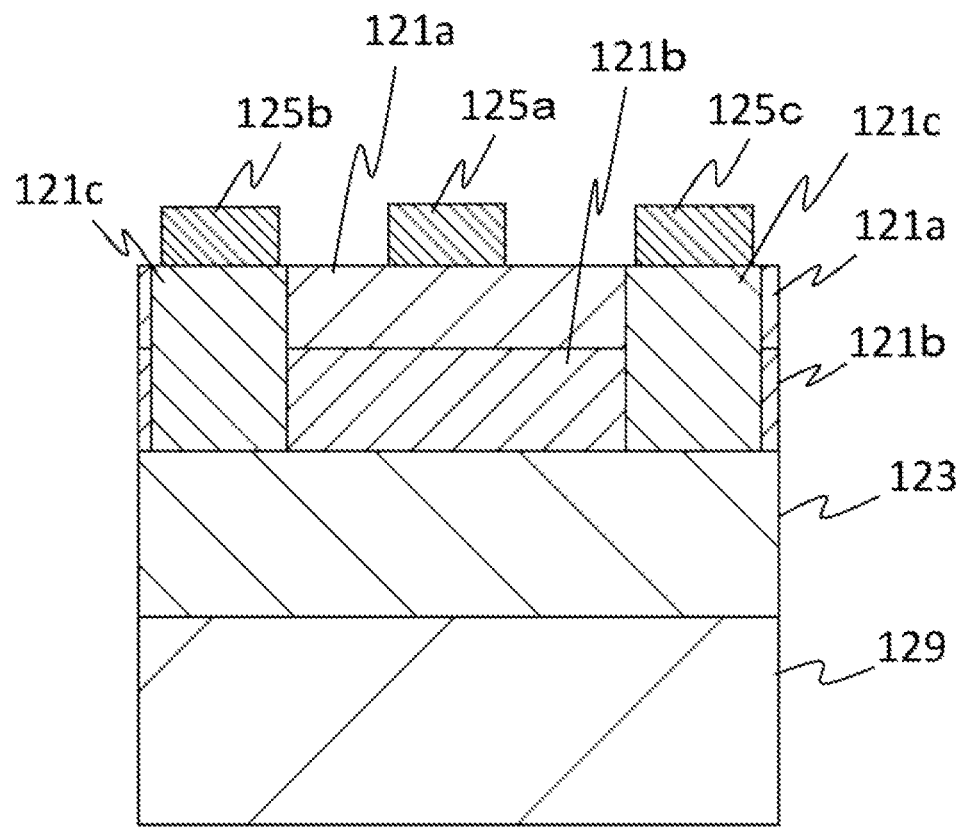
FIG. 5 shows a schematic view of a high electron mobility transistor (HEMT) as an embodiment.

FIG. 4 shows a Schottky barrier diode (SBD) including an $n^-$-type semiconductor layer 101a, an $n^+$- type semiconductor layer 101b, a p-type semiconductor layer 102, a metal layer 103, an electrically-insulating layer 104, a Schottky electrode 105a and an ohmic electrode 105b. The metal layer 103, made of a metal such as Al, for example, covers the Schottky electrode 105a. FIG. 5 shows a high electron mobility transistor (HEMT) including an n-type semiconductor layer 121a having a wide band gap, an n-type semiconductor layer 121b having a narrow band gap, an $n^+$-type semiconductor layer 121c, a p-type semiconductor layer 123, a gate electrode 125a, a source electrode 125b, a drain electrode 125c, and a substrate 129 (HEMT) including a high electron mobility transistor (HEMT).

Figure 6:
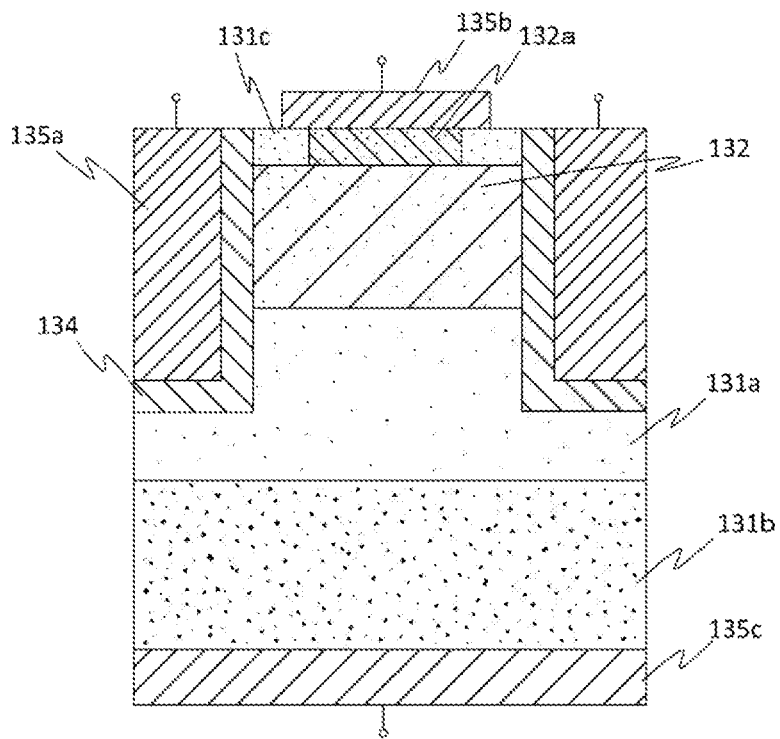
FIG. 6 shows a schematic view of a metal oxide semiconductor field effect transistor (MOSFET) as an embodiment.
Figure 7:
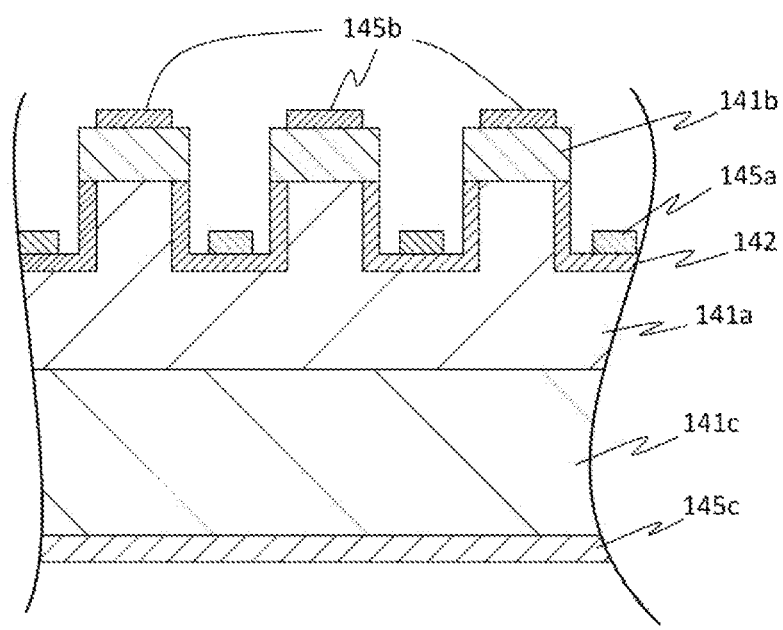
FIG. 7 shows a schematic view of a junction field effect transistor (JFET) as an embodiment.
Figure 8:
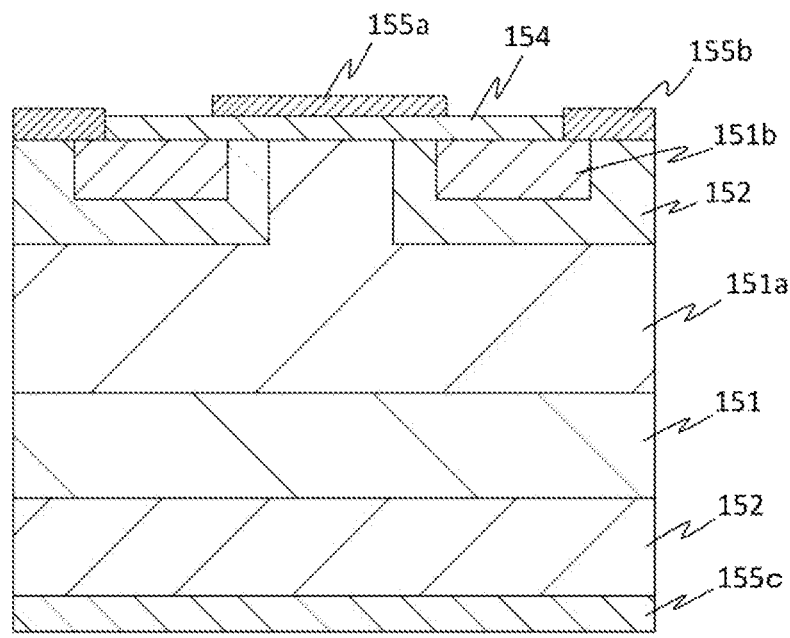
FIG. 8 shows a schematic view of an insulated gate bipolar transistor (IGBT) as an embodiment.

FIG. 6 shows a schematic view of an embodiment of a metal oxide semiconductor field-effect transistors (MOSFET) according to the present inventive subject matter. The MOSFET includes an n-type semiconductor layer 131a, a first $n^+$-type semiconductor layer 131b, a second $n^+$-type semiconductor layer 131c, a p-type semiconductor layer 132, a $p^+$-type semiconductor layer 132a, a gate insulating layer 134, a gate electrode 135a, a source electrode 135b and a drain electrode 135c. FIG. 7 shows a schematic view of an embodiment of a junction field-effect transistors (JFET) according to the present inventive subject matter including an $n^-$-type semiconductor layer 141a, a first $n^+$-type semiconductor layer 141b, a second $n^+$-type semiconductor layer 141c, a p-type semiconductor layer 142, a gate electrode 145a, a source electrode 145b and a drain electrode 145c. FIG. 8 shows a schematic view of an embodiment of an insulated gate bipolar transistor (IGBT) according to the present inventive subject matter including an n-type semiconductor layer 151, an $n^-$-type semiconductor layer 151a, an $n^+$-type semiconductor layer 151b, a p-type semiconductor layer 152, a gate insulating layer 154, a gate electrode 155a, an emitter electrode 155b and a collector electrode 155c.

(LED)

Figure 9:
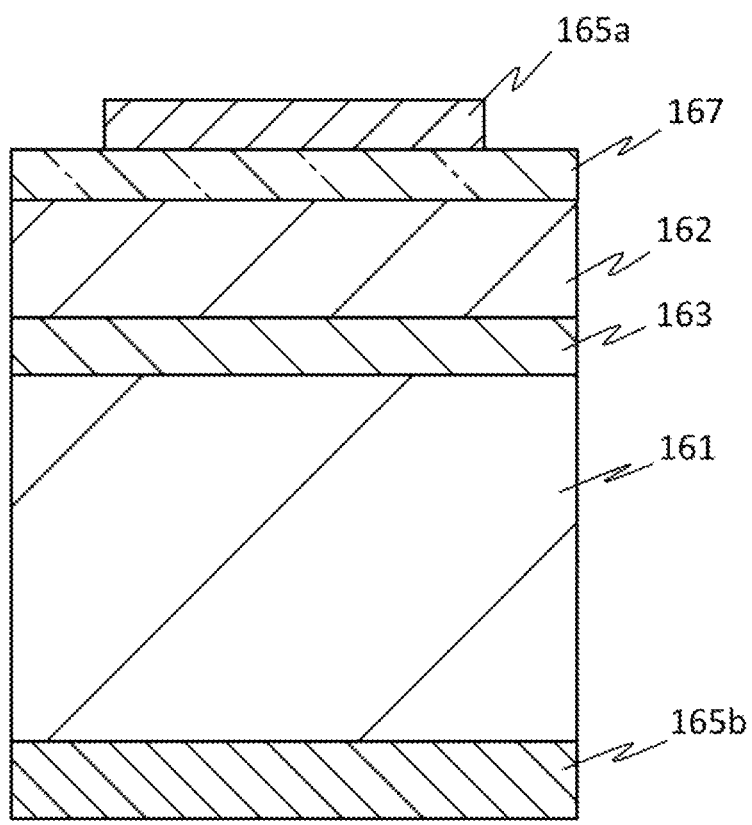
FIG. 9 shows a schematic view of a light emitting diode (LED) as an embodiment.

FIG. 9 shows a schematic view of an embodiment of a light emitting diode (LED) according to the present inventive subject matter. The LED shown in FIG. 9 includes an n-type semiconductor layer 161 on a second electrode 165b, and a light emitting layer 163 is positioned on the n-type semiconductor layer 161. Also, a p-type semiconductor layer 162 is positioned on the light emitting layer 163. A light-transmitting electrode 167, through that light emitted from the light emitting layer 163 is to be transmitted, is provided on the p-type semiconductor layer 162. A first electrode 165a is positioned on the light-transmitting electrode 167. The light emitting device shown in FIG. 9 may be covered with a protective layer except for the electrode portion.

Examples of the material of the light-transmitting electrode include oxide conductive material containing indium (In) or titanium (Ti). Regarding the material of the light-transmitting electrode, in detail, the material may be $In_2O_3$, $ZnO$, $SnO_2$, $Ga_2O_3$, $TiO_2$, $CeO_2$, or a mixed crystal containing two or more thereof, and the material may contain a dopant. By providing those materials using a known method such as sputtering, the light-transmitting electrode would be formed. Also, annealing may be carried out after forming the light-transmitting electrode, in order to make the electrode more transparent.

According to the light-emitting diode of FIG. 9, the light-emitting layer 163 is configured to emit light by applying a current to the p-type semiconductor layer 162, the light-emitting layer 163, and the n-type semiconductor layer, through the first electrode 165a as a positive electrode and the second electrode as a negative electrode.

Examples of the material of the first electrode 165a and the second electrode 165b include Al, Mo, Co, Zr, Sn, Nb, Fe, Cr, Ta, Ti, Au, Pt, V, Mn, Ni, Cu, Hf, W, Ir, Zn, In, Pd, Nd, Ag and alloys thereof, metal oxide conductive films such as tin oxide, zinc oxide, indium oxide, indium tin oxide (ITO), and indium zinc oxide (IZO), organic conductive compounds such as polyaniline, polythiophene, and polypyrrole, and mixtures of these materials. A method of forming the first and the second electrode is not particularly limited, and examples of the method of forming the first and the second electrode include wet methods such as a printing method, a spray method, and a coating method, physical methods such as a vacuum deposition method, a sputtering method, and an ion plating method, chemical methods such as a CVD method, and a plasma CVD method. The method may be selected from the above-mentioned methods in consideration of a suitability for the material of the first electrode and the second electrode.

Figure 10:
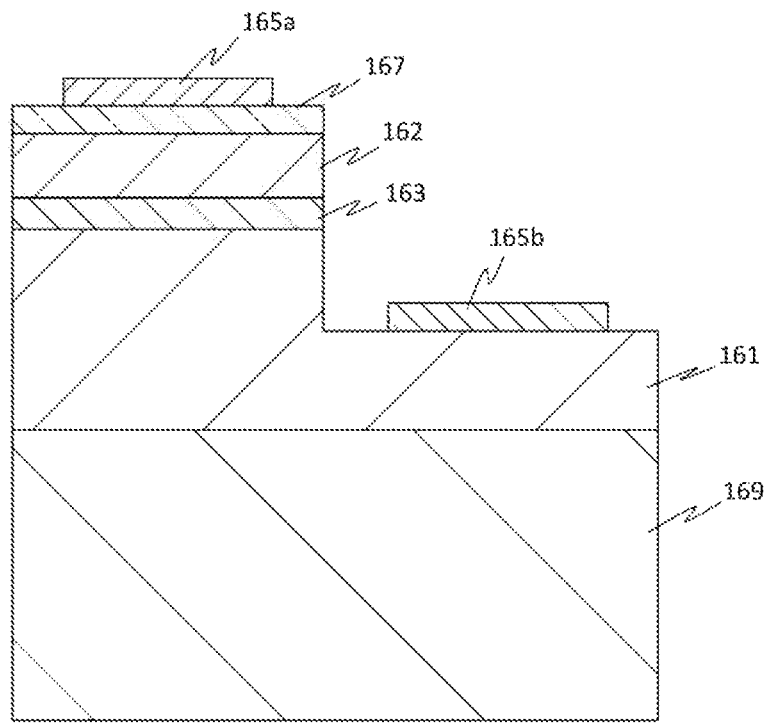
FIG. 10 shows a schematic view of a light emitting diode (LED) as an embodiment.

FIG. 10 shows a schematic view of another embodiment of a light emitting diode (LED) according to the present inventive subject matter. In the LED of FIG. 10, an n-type semiconductor layer 161 is arranged on the substrate 169, and the second electrode 165b is arranged on a part of the exposed surface of the n-type semiconductor layer 161, exposed from a p-type semiconductor layer 162, light-emitting layer 163 and the n-type semiconductor layer 161 that are partly cut out to expose the exposed surface of the n-type semiconductor layer 161.

Figure 11:
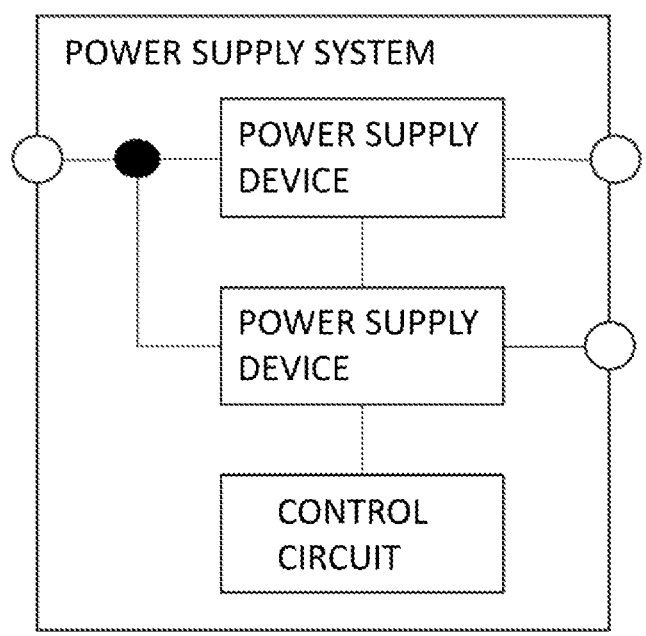
FIG. 11 shows a schematic view of a power supply system as an embodiment.

The semiconductor device may be used in a system including a power source device. The semiconductor device may be electrically connected to a wiring pattern of by use of a known method. FIG. 11 shows a schematic view of a power supply system as an embodiment, using two power supply devices and a control circuit.

Figure 12:
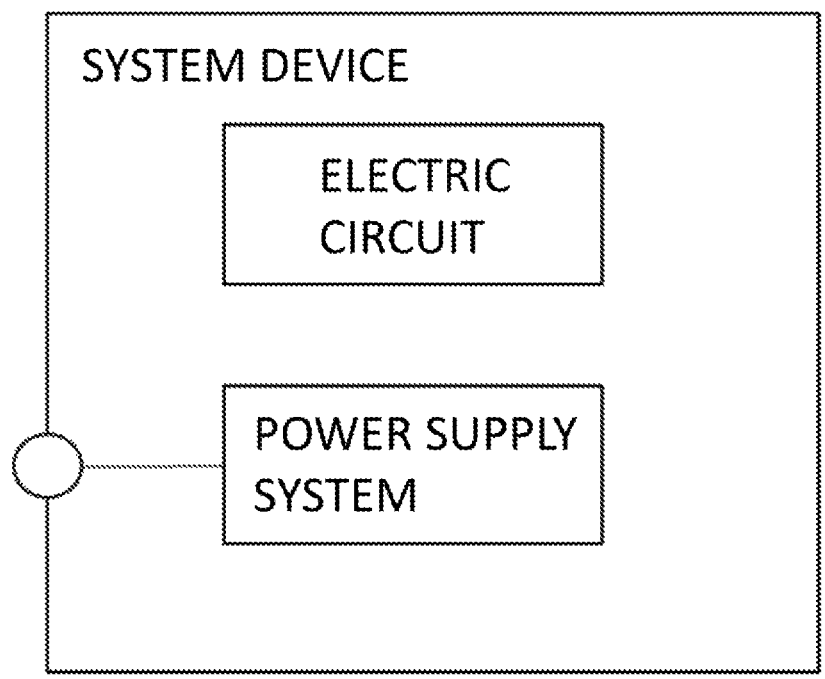
FIG. 12 shows a schematic view of a system device as an embodiment.
Figure 13:
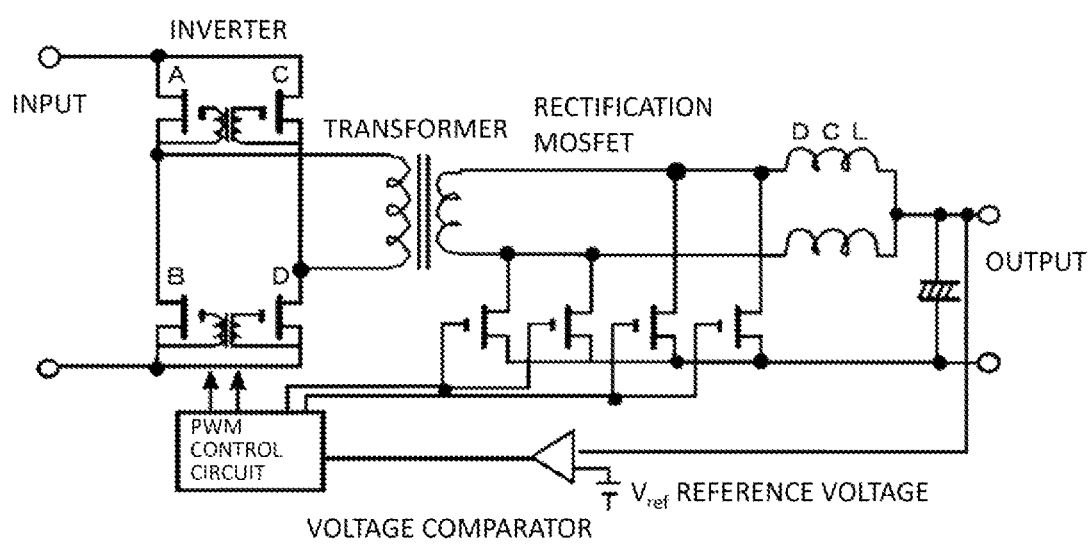
FIG. 13 shows a schematic view of a circuit diagram of a power supply device as an embodiment.

The power source system is used for a system device in combination with an electronic circuit. The power supply system may be used for a system device in combination with an electric circuit. FIG. 12 shows a schematic diagram of a system device according to an embodiment of a present inventive subject matter. FIG. 13 illustrates a power supply circuit of a power supply device, including a power circuit and a control circuit. A DC voltage is switched at high frequencies by an inverter (configured with MOSFET A to D) to be converted to AC, followed by insulation and transformation by a transformer. The voltage is then rectified by rectification MOSFETs and then smoothed by a DCL (smoothing coils L1 and L2) and a capacitor to output a direct current voltage. At this point, the output voltage is compared with a reference voltage by a voltage comparator to control the inverter and the rectification MOSFETs by a PWM control circuit to have a desired output voltage.

Hereinafter, examples of the present invention will be described, but the present invention is not limited thereto.

EXAMPLE 1

1. Film-Formation Apparatus

A mist CVD apparatus 19 used as film-formation apparatus in Examples according to a present inventive subject matter is described below with FIG. 1. The mist CVD apparatus 19 includes a susceptor 21 on which a substrate 20 is placed. The mist CVD apparatus 19 includes a carrier gas supply device 22a, a first flow-control valve 23a that is configured to control a flow of carrier gas sent from the carrier gas supply device 22a, a diluted gas supply device 22b, a second flow-control valve 23b to control a flow of a carrier gas that is configured to be sent from the diluted carrier gas supply device 22b, a mist generator 24 in that a raw material solution 24a is contained, a container 25 in that water 25a is contained, an ultrasonic transducer 26 attached to a bottom of the vessel 25, a supply pipe 27 that may be a quartz pipe with an inside diameter that may be 40 mm, and a heater 28 arranged at a peripheral portion of the supply pipe 27. The susceptor 21 includes a surface that is slanted off the horizontal and on that the substrate 20 is arranged. The susceptor 21 is made of quartz. Since the susceptor 21 and the supply pipe 27 that are configured to be a film-formation chamber are made of quartz, this configuration reduces a possibility that a foreign substance entering a film that is formed on the substrate 20.

2. Preparation of a Raw Material Solution

An aqueous solution was prepared as a raw material solution by mixing gallium acetylacetonate (with gallium concentration that is 0.05 mol/L) and 3-cyanopropyldimethylchlorosilane together, and the aqueous solution was adjusted to have the atomic ratio of silicon to gallium to be 1:0.005 and to contain 36% hydrochloric acid to be 1.5% at volume ratio.

3. Film-Formation Preparation

The raw material solution 24a obtained at 2. Preparation of the Raw-Material Solution above was set in the mist generator 24. Then, as a substrate 20, a c-plane sapphire substrate was placed on the susceptor 21, and the heater 28 was activated to raise the temperature of the heater 28 up to 500° C. The first flow-control valve 23a and the second flow-control valve 23b were opened to supply carrier gas from the carrier gas supply device 22a and the diluted carrier gas supply device 22b, which are the source of carrier gas, into the supply tube 27 to replace the atmosphere in the supply tube 27 with the carrier gas sufficiently. After the atmosphere in the supply tube 27 was sufficiently replaced with the carrier gas, the flow rate of the carrier gas from the carrier gas device 22a was regulated at 3.0 L/min, and the diluted carrier gas from the diluted carrier gas supply device 22b was regulated at 0.5 L/min. In this embodiment, nitrogen was used as the carrier gas.

4. Formation of a Film

The ultrasonic transducer 26 was then vibrated at 2.4 MHz, and the vibration was propagated through the water 25 to the raw material solution 24a to atomize the raw material solution 24a to form atomized droplets. The atomized droplets were carried by the carrier gas and introduced in the supply tube 27. The atomized droplets were thermally reacted adjacent to a surface of the substrate 20 at 500° C. under atmospheric pressure in the supply tube 27 to be formed into a film on the substrate 20. The film formation time was 30 minutes, and the film thickness was 750 nm.

Figure 2:
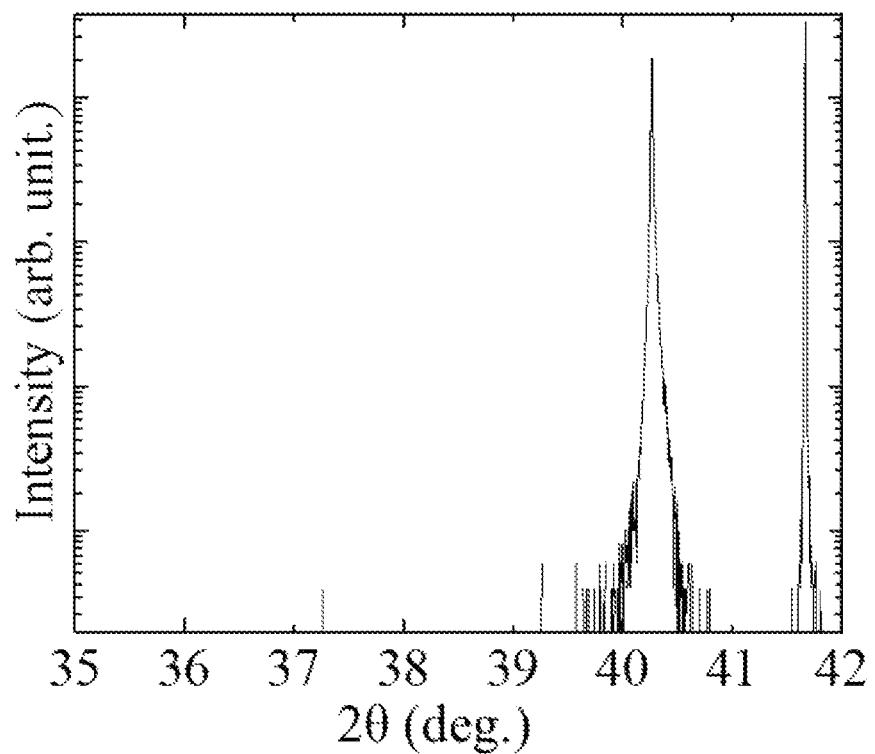
FIG. 2 shows an XRD (X-ray diffraction) measurement result in an Example.

Using an X-ray diffraction (XRD) device, the film obtained at 4. Formation of a Film described above was identified as α-$Ga_2O_3$. FIG. 2 shows the result of XRD measurement.

EXAMPLE 2

A semiconductor film was obtained under the same conditions as the conditions of Example 1 except one condition: the aqueous solution was adjusted such that the atomic ratio of silicon to gallium was to be 1:0.002 in the raw material solution.

EXAMPLE 3

A semiconductor film was obtained under the same conditions as the conditions of Example 1 except one condition: the aqueous solution was adjusted such that the atomic ratio of silicon to gallium was to be 1:0.001 in the raw material solution.

Test Example 1

Figure 3:
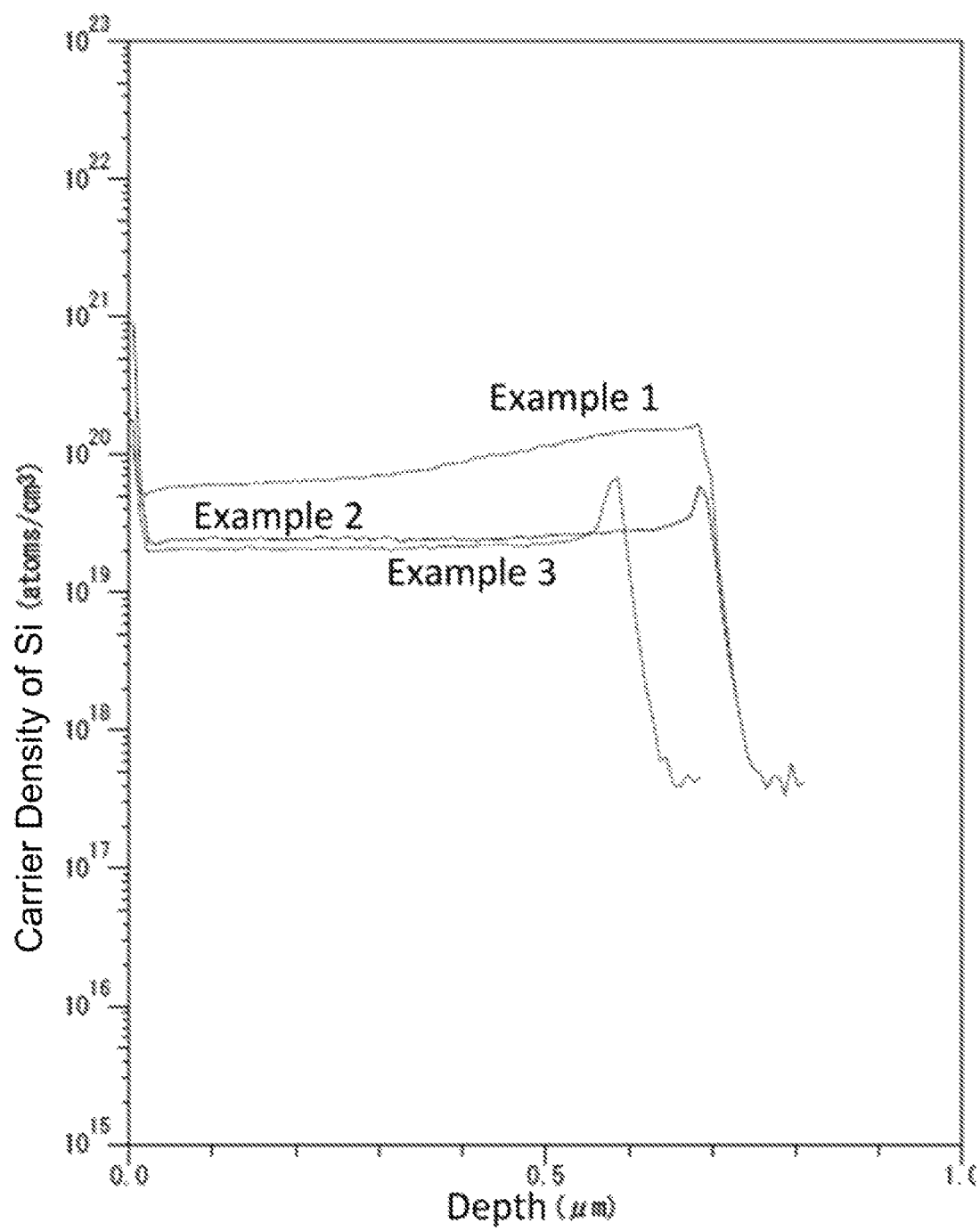
FIG. 3 shows a SIMS measurement result of an Example.

The films obtained at Examples 1, 2, and 3 were analyzed by using a Secondary Ion Mass Spectrometry (SIMS) (device: CAMECA IMS-7f, a primary ion: $Cs^+$, a primary acceleration voltage: 15.0 kV, detection area 30 μmφ). FIG. 3 shows the result, showing that silicon as the dopant is evenly doped in the semiconductor films approximately up to 0.6 μm in depth from surfaces of the semiconductor films.

Text Example 2

A Hall effect of each of the semiconductor films obtained through the Example 1 to Example 3 was measured by using the van der pauw method. The carrier density of the semiconductor film of Example 1 was $6.7 \times 10^{18}$ $cm^3$, the carrier density of the semiconductor film of Example 2 was $1.71 \times 10^{19}$ $cm^3$, and the carrier density of the semiconductor film of Example 3 was $2.29 \times 10^{19}$ $cm^3$. Also, the semiconductor film of Example 1 had electron mobility that was 3.0 $cm^2$/Vs. The semiconductor film of Example 2 had electron mobility that was 5.31 $cm^2$/Vs. The semiconductor film of Example 3 had electron mobility that was 16.6 $cm^2$/Vs.

EXAMPLE 4

A semiconductor film was obtained under the same conditions as the conditions of Example 1 except that the aqueous solution was adjusted such that the atomic ratio of silicon to gallium in the raw material solution was 1:0.0001 and the film-formation time was 1 hour.

Test Example 3

Figure 14:
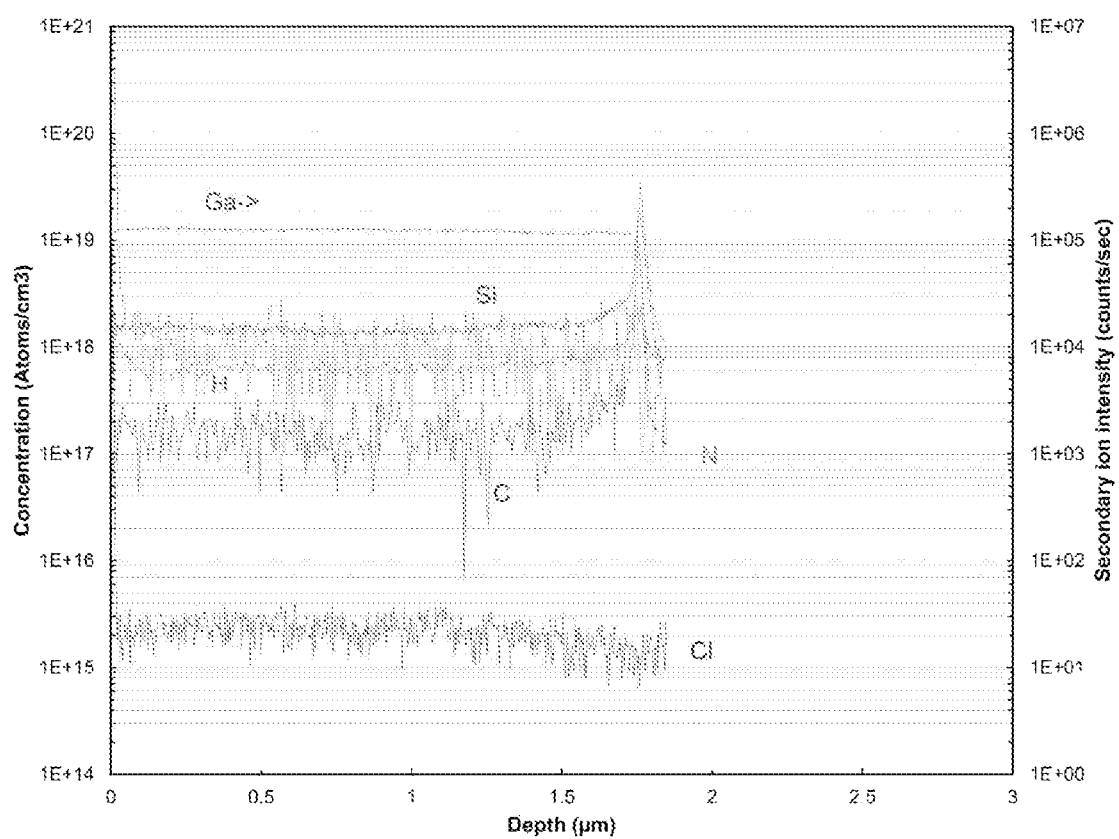
FIG. 14 shows a SIMS measurement result of an Example.

A SIMS analysis was conducted on the film obtained at Example 4 in the same manner as in the Text Example 1. FIG. 14 shows the result, showing that silicon as the dopant is evenly doped in the semiconductor film in a range of 0.1 μm to 0.6 μm in depth from a surface of the semiconductor film.

Semiconductor films of the present inventive subject matter are applicable to semiconductor devices (e.g., chemical compound semiconductor devices), electric components, electronic devices, optical and electronic photography-related devices, and industrial parts. Since the semiconductor films of the present inventive subject matter have enhanced semiconductor properties, the semiconductor films are, in particular, applicable to semiconductor devices.

19 a mist CVD apparatus
20 a substrate
21 a susceptor
22a a carrier gas supply device
22b a diluted carrier gas supply device
23a a flow-control valve of carrier gas
23b a flow-control valve of diluted carrier gas
24 a mist generator
24a a raw material solution
25 a vessel
25a water
26 an ultrasonic transducer
27 a supply tube
28 a heater
29 an exhaust port
101a an n⁻-type semiconductor layer
101b an n⁺-type semiconductor layer
102 a p-type semiconductor layer
103 a metal layer
104 an electrically-insulating layer
105a a Schottky electrode
105b an Ohmic electrode
121a an n-type semiconductor layer with a wide band gap
121b an n-type semiconductor layer with a narrow band gap
121c an n+-type semiconductor layer
123 a p-type semiconductor layer
125a a gate electrode
125b a source electrode
125c a drain electrode
128 a buffer layer
129 a substrate
131a an n⁻-type semiconductor layer
131b a first n⁺-type semiconductor layer
131c a second n⁺-type semiconductor layer
132 a p-type semiconductor layer
134 a gate insulating film
135a a gate electrode
135b a source electrode
135c a drain electrode
138 a buffer layer
139 a semi-insulating layer
141a an n⁻-type semiconductor layer
141b a first n⁺-type semiconductor layer
141c a second n⁺-type semiconductor layer
142 a p-type semiconductor layer
145a a gate electrode
145b a source electrode
145c a drain electrode
151 an n-type semiconductor layer
151a an n⁻-type semiconductor layer
151b an n⁺-type semiconductor layer
152 a p-type semiconductor layer
154 a gate insulating layer
155a a gate electrode
155b an emitter electrode
155c a collector electrode
161 an n-type semiconductor layer
162 a p-type semiconductor layer
163 a light-emitting layer
165a a first electrode
165b a second electrode
167 a light-transmitting electrode
169 a substrate

What is claimed is:

1. A raw material solution comprising:
a dopant material comprising a dopant, a halogen, and a hydrocarbon group that is optionally substituted or a heterocyclic group that is optionally substituted; and gallium,
wherein the dopant material is contained in the raw material solution as a complex compound, and
wherein the dopant comprises silicon (Si).

2. The raw material solution of claim 1,
wherein the hydrocarbon group that is optionally substituted or the heterocyclic group that is optionally substituted is a hydrocarbon group comprising a substituent that is a cyano group.

3. The raw material solution of claim 1,
wherein the hydrocarbon group that is optionally substituted or the heterocyclic group that is optionally substituted comprises two or more substituents.

4. The raw material solution of claim 1,
wherein the halogen is chlorine.

5. The raw material solution of claim 1, wherein
the complex compound is represented by a chemical formula that is $XMR^1_l R^2_m R^3_n$,
wherein X represents a halogen atom, M represents a dopant, $R^1$ represents a hydrocarbon group that is optionally substituted or a heterocyclic group that is optionally substituted, $R^2$ represents a hydrocarbon group that is optionally substituted or heterocyclic group that is optionally substituted and $R^2$ is the same as $R^1$ or different from $R^1$, $R^3$ represents a hydrocarbon group that is optionally substituted or a heterocyclic group that is optionally substituted and the same as $R^1$ and/or $R^2$ or different from $R^1$ and/or $R^2$, and
wherein l represents an integer from one to three, m represents an integer from one to three and m is the same integer as l or a different integer from l, n represents an integer from one to three and n is the same integer as l and/or m or a different integer from l and/or m.

6. A method of manufacturing a semiconductor film, the method comprising:
generating atomized droplets from the raw material solution of claim 1.

7. A method of manufacturing a semiconductor film, the method comprising:
generating atomized droplets from a raw material solution comprising at least a dopant material that comprises a dopant and a halogen, the dopant material being comprised in the raw material solution as a complex compound,
wherein the dopant comprises silicon (Si).

8. The method of claim 7,
wherein the raw material solution further comprises a semiconductor material comprising at least one of gallium, aluminum and indium.

9. The method of claim 7, further comprising:
carrying the atomized droplets onto a surface of a base by carrier gas.

10. The method of claim 9, further comprising:
causing a thermal reaction of the atomized droplets to form a semiconductor film on the surface of the base.

11. A semiconductor film manufactured by the method of claim 7.

12. A semiconductor film comprising:
a corundum-structured oxide semiconductor as a major component; and
Si that is doped into the semiconductor film as a dopant so that a carrier density of Si is $1\times10^{18}/cm^3$ or more in a depth ranged at least from 0.1 μm to 0.5 μm from a surface of the semiconductor film.

13. The semiconductor film of claim 12,
wherein the dopant is doped with a carrier density that is in a range of $1\times10^{18}/cm^3$ or more to $1\times10^{20}/cm^3$ or less.

14. The semiconductor film of claim 12,
wherein the corundum-structured oxide semiconductor comprises at least gallium.

15. A semiconductor device comprising:
the semiconductor film of claim 14;
a first electrode containing at least one selected from among Al, Mo, Co, Zr, Sn, Nb, Fe, Cr, Ta, Ti, Au, Pt, V, Mn, Ni, Cu, Hf, W, Ir, Zn, In, Pd, Nd, and Ag and electrically connected to the semiconductor film; and
a second electrode containing at least one selected from among Al, Mo, Co, Zr, Sn, Nb, Fe, Cr, Ta, Ti, Au, Pt, V, Mn, Ni, Cu, Hf, W, Ir, Zn, In, Pd, Nd, and Ag and electrically connected to the semiconductor film.

16. The semiconductor device of claim 15, wherein the first electrode and the second electrode are positioned at a first side of the semiconductor film.

17. The semiconductor device of claim 15, wherein the first electrode is positioned at a first side of the semiconductor film, and the second electrode is positioned at a second side of the semiconductor film.

18. The semiconductor film of claim 12,
wherein the corundum-structured oxide semiconductor further comprises aluminum and/or indium.

19. The semiconductor film of claim 12, wherein the semiconductor film is an n-type semiconductor film.

20. The semiconductor film of claim 12, wherein a carrier density of Si is $1\times10^{20}/cm^3$ or less.

21. A semiconductor film comprising:
Si that is doped into the semiconductor film as a dopant to a depth that is at least 0.3 μm or deeper from a surface of the semiconductor film; and
100 μm or less in film thickness with electron mobility that is 1 $cm^2/Vs$ or more,
wherein the semiconductor film has a corundum structure.

22. The semiconductor film of claim 21, wherein the carrier density of Si is $1\times10^{20}/cm^3$ or less.

* * * * *